United States Patent
Li et al.

(10) Patent No.: US 10,141,736 B2
(45) Date of Patent: Nov. 27, 2018

(54) METHOD FOR IDENTIFYING TYPE OF FAULT ON POWER LINE

(75) Inventors: Yongli Li, Tianjin (CN); Botong Li, Tianjin (CN); Li Chen, Tianjin (CN); Bin Su, Beijing (CN)

(73) Assignee: ABB Research Ltd., Zurich (CH)

( * ) Notice: Subject to any disclaimer, the term of this patent is extended or adjusted under 35 U.S.C. 154(b) by 612 days.

(21) Appl. No.: 13/380,538

(22) PCT Filed: Jun. 26, 2009

(86) PCT No.: PCT/CN2009/072472
§ 371 (c)(1),
(2), (4) Date: Dec. 23, 2011

(87) PCT Pub. No.: WO2010/148570
PCT Pub. Date: Dec. 29, 2010

(65) Prior Publication Data
US 2012/0095707 A1    Apr. 19, 2012

(51) Int. Cl.
*H02H 7/26* (2006.01)
*G01R 31/08* (2006.01)
*H02H 1/00* (2006.01)

(52) U.S. Cl.
CPC ........... *H02H 7/267* (2013.01); *G01R 31/085* (2013.01); *H02H 1/00* (2013.01)

(58) Field of Classification Search
CPC ........ G01R 27/18; G01R 31/086; H02H 3/16; H02H 7/26; Y04S 10/522
USPC ......................................................... 702/58
See application file for complete search history.

(56) References Cited

U.S. PATENT DOCUMENTS

| | | | | |
|---|---|---|---|---|
| 4,314,199 | A | * | 2/1982 | Yamaura .............. G01R 31/088 324/521 |
| 6,525,543 | B1 | * | 2/2003 | Roberts et al. ............... 324/522 |
| 6,768,620 | B2 | | 7/2004 | Kim et al. |
| 8,271,214 | B2 | * | 9/2012 | Sezi ................................. 702/59 |
| 8,680,873 | B2 | * | 3/2014 | Yang et al. ................... 324/543 |
| 2005/0195538 | A1 | | 9/2005 | Khoroshev et al. |
| 2008/0030912 | A1 | * | 2/2008 | Khoroshev ..................... 361/59 |

FOREIGN PATENT DOCUMENTS

| CN | 1359010 A | 7/2002 |
|---|---|---|
| CN | 1180271 C | 12/2004 |
| CN | 1588729 A | 3/2005 |
| CN | 1933270 A | 3/2007 |

(Continued)

OTHER PUBLICATIONS

EPO translation of JP-2008259327 A.*

(Continued)

*Primary Examiner* — Kyle R Quigley
(74) *Attorney, Agent, or Firm* — J. Bruce Schelkopf; Taft Stettinius & Hollister LLP

(57) ABSTRACT

A method for identifying the type of faults occurred on a power line, characterized in that it comprises: calculating a fault point voltage on fault points based on terminal voltage and fault locations of the power line; adopting the fault point voltage corresponding to a maximum transition resistance as a setting value; comparing the fault point voltage on fault points with the setting value; and identifying the type of fault as a permanent type or a transient type based on the result of the comparison.

13 Claims, 11 Drawing Sheets

(56) References Cited

FOREIGN PATENT DOCUMENTS

| CN | 101316036 A | 12/2008 | | |
|---|---|---|---|---|
| CN | 100459355 C | 2/2009 | | |
| CN | 101359822 A | 2/2009 | | |
| JP | 2008259327 A | * | 10/2008 | ............... H02H 3/06 |
| RU | 2305292 C1 | 8/2007 | | |

OTHER PUBLICATIONS

ISA/CN International Search Report re PCT Application No. PCT/CN2009/072472, dated Apr. 8, 2010.
Examination Report for India Application No. 9791/CHENP/2011, dated Mar. 29, 2017, 7 pages.
The Patent Office of The P.R. of China, First Office Action and Patent Search Report for corresponding application CN 200980159977.5, dated May 28, 2013, 20 pages.
The Patent Office of The P.R. of China, Second Office Action for corresponding application CN 200980159977.5, dated Jan. 21, 2014, 17 pages.
The Patent Office of The P.R. of China, Third Office Action and Patent Search Report for corresponding application CN 200980159977.5, dated Jan. 25, 2014, 22 pages.
The Patent Office of The P.R. of China, Fourth Office Action for corresponding application CN 200980159977.5, dated Feb. 13, 2015, 10 pages.
Z. Yuping et al., "Study on self-adaptive auto-reaching for parallel transmission lines," Automation of Electric Power Systems, dated Nov. 25, 2004, pp. 58-60, vol. 28, No. 22, Tsinghua Tongfang Knowledge Network Technology Co., Ltd., Beijing, China.
European Patent Office, Supplementary European Search Report for corresponding application EP 09846370.6, dated Dec. 1, 2012, 6 pages.
A. Halim et al., "Auto-reclose performance on 275kV and 132kV transmission line in Malaysia," Transmission and Distribution Conference and Exhibition 2002: Asia Pacific, dated Feb. 19, 2003, pp. 603-608, IEEE.
M. Sanaye-Pasand et al., "Design of an online adaptive auto-reclose algorithm for HV transmission lines," Power India Conference, dated Jun. 5, 2006, 5 pages, IEEE.
J. Jiang et al., "Digital protective relaying algorithms for double circuit lines protection," International Conference on Power System Technology, 2002 Proceedings, dated Dec. 10, 2002, pp. 2551-2555, IEEE.
A. G. Jongepier et al., "Adaptive distance protection of a double-circuit line," IEEE Transactions on Power Delivery, dated Jul. 1994, pp. 1289-1297, vol. 9, No. 3, IEEE.
M. M. Eissa et al., "Experimental results of a supplementary technique for auto-reclosing EHV/UHN transmission lines," IEEE Transactions on Power Delivery, dated Nov. 7, 2002, pp. 702-707, vol. 17, No. 3, IEEE.
G. C. Thomann et al., "Non-optimum compensation schemes for single pole reclosing on EHV double circuit transmission lines," IEEE Transactions on Power Delivery, dated Apr. 1993, pp. 651-659, vol. 8, No. 2, IEEE.
G. W. Donaldson et al., "Sequential switching of dump resistors and reclosing on a 100 kJ system," IEEE Transactions on Magnetics, dated May 1983, pp. 1097-1100, vol. 19, No. 3, IEEE.
C. H. Ong et al., "The co-ordination of protection and auto-reclose on 11kV distribution networks," IEE Colloquium on Improving Supply Security on 11kV Overhead Networks, dated Aug. 6, 2002, 8 pages, IET.
R. J. Owen et al., "Telecontrol for the auto-reclose protection of rural distribution schemes and the changing needs of the REC's," Fourth International Conference on Trends in Distribution Switchgear, dated Nov. 1994, pp. 95-100, IET.
D. R. Joens et al "Application of single phase sectionalizers with three phase reclosers to increase reliability," Rural Electric Power Conference, dated Jun. 28, 2004, pp. B2-1-9, IEEE.
Z. M. Radojević et al., "A numerical algorithm for adaptive reclosing based on calculation of the faulted phase voltage total harmonic distorsion factor," Power Engineering Society General Meeting, dated Jan. 10, 2005, 5 pages, IEEE.
S. P. Websper et al., "An investigation into breaker reclosure strategy for adaptive single pole autoreclosing," IEE Proceedings—Generation, Transmission and Distribution, dated Nov. 1995, pp. 601-607, vol. 142, No. 6, IET.
S. O. Faried., "An adaptive short-time compensation scheme for improving power system stability and reducing turbine-generator shaft torsional torques," IEEE Transactions on Power Systems, dated May 2000, pp. 785-790, vol. 15, No. 2, IEEE.
K. Brewis, "Integrated protection and auto-reclose control of source circuit-breakers," IEE Colloquium on Improving Supply Security on 11kV Overhead Networks, dated Aug. 6, 2002, 4 pages, IET.
D. S. Fitton et al., "The application of neural network techniques to adaptive autoreclosure in protection equipment," Fifth International Conference on Developments in Power System Protection, dated Aug. 6, 2002, pp. 161-164, IET.
D. A. Keeling, "Application of ethernet peer-peer communication to a mesh corner delayed auto-reclose scheme," Eighth IEE International Conference on Developments in Power System Protection, dated Dec. 13, 2004, pp. 652-655, IET.
S. B. Tennakoon et al., "Performance evaluation of an internally energised thyristor circuit breaker with rapid auto reclose," Eighth Annual Applied Power Electronics Conference and Exposition, dated Aug. 6, 2002, pp. 686-690, IEEE.
"The study of relay protection for 500kV honggou-langwang one tower with double-circuit transmission line," Sec. 3.3, dated Apr. 3, 2003, 69 pages.

* cited by examiner

METHOD FOR IDENTIFYING TYPE OF FAULT ON POWER LINE

RELATED APPLICATION

This application is a national filing of PCT application Serial No. PCT/CN2009/072472, filed Jun. 26, 2009.

FIELD OF THE INVENTION

The method proposed in present invention relates to a criterion for identifying fault type on a power line. In particular, it relates to an identifying criterion applicable to multiple circuit power lines.

BACKGROUND OF THE INVENTION

A multiple-circuit power line is a power line where at least two circuits are carried on a tower line. In the case of two circuits, the number of fault types is up to 120 and their characteristics are different from each other. In the case of four or more circuits, the number of fault types could be even much more. Up to now, there is no effective method or criterion to distinguish the fault features for double-circuit lines or multiple circuit lines. Traditional voltage magnitude criterion used for single line is easily affected by electromagnetic coupling voltage. Moreover, the traditional terminal voltage magnitude criterion for single line may get wrong judgments for the permanent fault with transition resistance.

A significant feature of multiple-circuit lines is the great coupling effect of inductance and capacitance among the different lines, the various fault types and the complexly varying recovery voltage of opened faulty-phase. Therefore, it is difficult to distinguish the transient faults from the permanent faults occurred in multiple power lines and there are no practical method put forward now.

At present, the main criterions or methods of adaptive reclosure for single line which have be put forward and used in practical contain voltage magnitude criterion and voltage compensating criterion. The traditional single-phase adaptive reclosing criterion takes the opened phase voltage as a setting value and takes the electromagnetic coupling voltage as a threshold value to discriminate fault property. In some conditions, it brings limitations such as great errors, low sensitivity and narrow applicable range. Consequently, considering the complex features of the faults on multiple-circuit power lines, the criterions which can be used on single line are not suitable to identify the fault property of multiple circuit lines.

The present invention proposes a criterion and a reclosure scheme based on technical guide for protective relay and reclosure of parallel power lines issued by State Grid Corporation for double-circuit lines. The whole disclosure of above technical guide is incorporated herein as a part of the description of present invention by way of reference.

DESCRIPTION OF THE INVENTION

It is therefore an objective of the invention to effectively and accurately identify the fault type in multiple power lines and single power line.

In a multiple circuit line, most of the fault is a single line fault and double line fault. The possibility of a fault occurred on three or more lines is very low. In present invention, a fault identifying method for identifying the type of fault on double line or single line is proposed. The proposed fault type identifying method can be similarly applied to any single line or two lines of a multiple power line system.

The criterion proposed in present invention uses electrical quantities on both ends and fault locations to calculate a fault point voltage. The criterion uses the fault point voltage to judge the feature of fault. It overcomes the limitation that the traditional voltage magnitude criterion is easily affected by electromagnetic coupling voltage. For all types of fault on a double-circuit line or single circuit line, the criterion can adaptively give different reclosure schemes. For the judgments of the grounding faults, the setting value of the criterion uses a floating threshold based on the fault point voltage when the permanent fault with the maximum transition resistance occurs. It insures the correctness of judgments for the permanent faults with transition resistance. The criterion has considered the different extinction time of secondary arc to earth and phase-to-phase secondary arc.

The criterion is used to distinguish the transient faults from the permanent faults and reclose the tripped breakers in a short time so as to reinforce the security and stability of power system. The criterion provides the adaptive settings for different fault types with higher accuracy and faster speed. The criterion ensures the correctness of judgments for the permanent fault with transition resistance.

The difference between the criterions proposed in present invention and traditional criterions mainly lies in: the proposed criterion uses the fault point voltage to judge the fault property while traditional criterions use the terminal voltage; the proposed criterion can distinguish the transient fault from permanent fault exactly for double-circuit lines; for all types of faults, the proposed criterion gives different adaptive reclosure schemes, but traditional criterions only consider single phase fault; the proposed criterion considers the influence of the transition resistance while traditional criterions haven't thought about it; and the proposed criterion considers the different extinction time of secondary arc to earth and phase-to-phase secondary arc.

The advantages of the Invention lies in: the complex fault types of double-circuit lines are considered fully and theoretical analysis and practical verification are made to show the veracity and reliability of the criterion; the proposed criterion overcomes the problem of voltage magnitude criterion using in single lines; the proposed criterion overcomes the limitation that traditional terminal voltage magnitude criterion is easily affected by the electromagnetic coupling voltage; the proposed criterion insures the correctness of judgments for the permanent faults with transition resistance; the proposed criterion considers the different extinction time of secondary arc to earth and phase-to-phase secondary arc; the effect of fault location errors and line parameter errors on the criterion is analyzed, and a method is presented to improve the accuracy of the criterion by increasing confidence coefficient; and Sequential reclosure is considered in present invention, and line transmission capacity can be resumed maximally in shortest time.

According to one aspect of present invention, a method is provided for identifying the type of faults occurred on a power line, characterized in that it comprises: calculating a fault point voltage on fault points based on terminal voltage and fault locations of the power line; adopting the fault point voltage corresponding to a maximum transition resistance as a setting value; comparing the fault point voltage on fault points with the setting value; and identifying the type of fault as a permanent type or a transient type based on the result of the comparison.

Preferably, the method further comprises: the power line is a multiple power line; calculating the difference of voltage for different faulty phases of the multiple power line; comparing the calculated voltage difference with a fault-type-dependent threshold; and identify the type of fault as a permanent inter-phase type or a transient inter-phase type based on the result of the comparison.

Preferably, the method further comprises: one of the different faulty phases is an open phase and the other one is a reclosed phase in the case of same-name phase fault across multiple power lines.

Preferably, the method further comprises: both of the different faulty phases are open phases in the case of different-name phase fault across multiple power lines.

Preferably, the method further comprises: identifying the type of fault as a permanent type in the case of the fault point voltage is less than the setting value; and identifying the type of fault as a transient type in the case of the fault point voltage is bigger than the setting value.

Preferably, the method further comprises: the setting value is calculated based on voltage and current on faulty and sound phases; as well as a coefficient matrix of homogenous power line equation.

According to another aspect of present invention, a method is provided for identifying the type of faults occurred on a power line, characterized in that it comprises: calculating a fault point voltage on fault points based on terminal voltage; adopting a fault-type-dependent setting value based on capacitive coupling voltage; comparing the fault point voltage on fault points with the setting value; and identifying the type of fault as a permanent type or a transient type based on the result of the comparison.

Preferably, the method further comprises: the power line is a multiple power line; identifying the type of fault as a permanent type in the case of the fault point voltage is less than the setting value; and identifying the type of fault as a transient type in the case of the fault point voltage is bigger than the setting value.

According to another aspect of present invention, a computer program is provided for identifying the type of faults occurred on a power line, wherein, the computer program is loadable into a internal memory of a digital processor and comprises computer program code means to make, when said program is loaded into said internal memory, the computer execute the method mentioned above.

According to another aspect of present invention, a fault type identifying controller is provided for identifying the type of faults occurred on a power line, characterized in that it comprises: a calculating unit for calculating a fault point voltage on fault points based on terminal voltage and fault locations of the multiple power lines; a setting value setup unit for adopting the fault point voltage calculated corresponding to a maximum transition resistance as a setting value; a comparing unit for comparing the fault point voltage on fault points with the setting value; and an identifying unit for identifying the type of fault as a permanent type or a transient type based on the result of the comparison.

Preferably, the controller further comprises: the calculating unit further calculating the difference of voltage for different faulty phases; the comparing unit further comparing the calculated voltage difference with a fault-type-dependent threshold; and the identifying unit further identify the type of fault as a permanent inter-phase type or a transient inter-phase type based on the result of the comparison.

According to another aspect of present invention, a fault type identifying controller is provided for identifying the type of faults occurred on a power line, characterized in that it comprises: a calculating unit for calculating a fault point voltage on fault points based on terminal voltage; a setting value setup unit adopting a fault-type-dependent setting value based on capacitive coupling voltage; a comparing unit for comparing the fault point voltage on fault points with the setting value; and an identifying unit for identifying the type of fault as a permanent type or a transient type based on the result of the comparison.

BRIEF DESCRIPTION OF THE DRAWINGS

Further embodiments, advantages and applications of the invention are disclosed in the claims as well as in the following description, which makes reference to the accompanied FIG. 1-11, wherein:

EMBODIMENTS OF THE INVENTION

Figure 1:
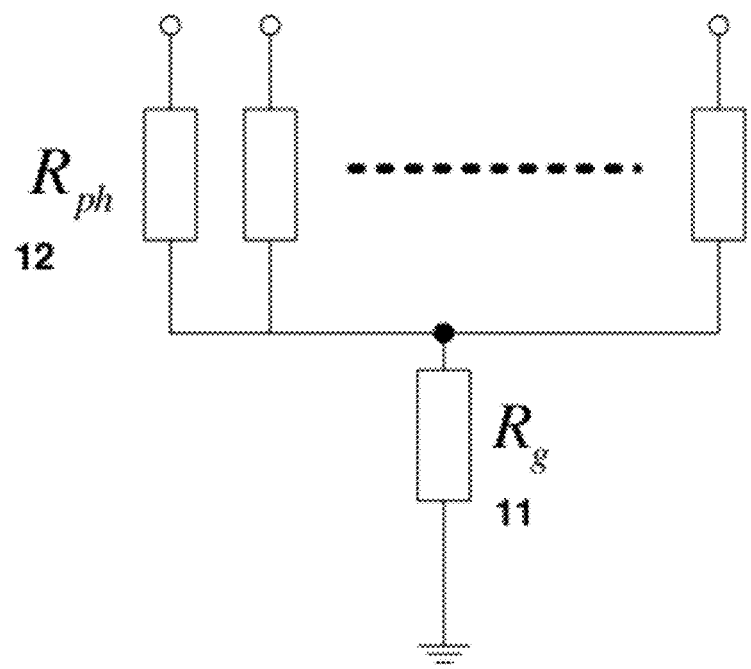
FIG. 1 shows a diagram of multi-phase to ground fault with the transition resistance model.

In order to maintain system stability and transmission or distribution capability, the tripping schemes of parallel double-circuit power lines on the same tower should have the ability that the number of sound phases is left as much as possible, especially the ability of quasi-full-phase operation. In a traditional approach, the faulty phase is tripped in case of a single phase fault, and all three phases are tripped in case of a multi-phase fault. In present invention, however, the fault phases are tripped in phase. That is, if the number of different phases remained in the two lines are at least two, only all fault phases are tripped. If there is only one sound phase or two same-name phases left, all the phases of double-circuit lines are tripped. Operation in phase can remain much more sound phases continuing to operate, which makes the transformation impedance inserted between generator and system much smaller, and decreases the unused transient energy in reclosing process.

The proposed criterion is based on homogeneous power line model; contrary to the traditional approach which uses terminal voltage only, it uses the terminal voltage and fault location to calculate a fault point voltage. When a grounding fault occurs, first, compare the product of sum of opening phase voltage at fault point and a coefficient with setting value to identify whether the secondary arc is extinct on grounding branches, and then identify whether the secondary arc is extinct on inter-phase branches. Wherein, a secondary arc is an arc caused by contact bounce. The first arc is extinguished when contacts close. Then a second arc is created when contacts bounce open again.

For the faults on inter-phase branches, two methods are proposed to identify whether the secondary arc is extinct on inter-phase branches on crossing lines, and then recloses the opened breaker under the different fault types of reclosure scheme. The procedure for identifying fault types has the following three main sections:
- calculate a setting value in real time;
- calculate the fault point voltage; and
- identify the fault type based on the comparison of calculated fault point voltage and setting value.

The detailed processes for each section are explained thereafter.

Calculation of Fault Point Voltage

The fault point voltage can be calculated by the following method whether permanent fault or transient fault occurs.

First, the terminal voltage phasor and current phasor is converted to a module by phase-model transformation. For a convenient calculation, a Karranbauer transformation is adopted in present invention. The transform matrix is shown as below:

$$S = \frac{1}{6}\begin{bmatrix} 1 & 1 & 1 & 1 & 1 & 1 \\ 1 & -1 & 0 & 1 & -1 & 0 \\ 1 & 0 & -1 & 1 & 0 & -1 \\ 1 & 1 & 1 & -1 & -1 & -1 \\ 1 & -1 & 0 & -1 & 1 & 0 \\ 1 & 0 & -1 & -1 & 0 & 1 \end{bmatrix} \quad \text{(C-1)}$$

$$S^{-1} = \begin{bmatrix} 1 & 1 & 1 & 1 & 1 & 1 \\ 1 & -2 & 1 & 1 & -2 & 1 \\ 1 & 1 & -2 & 1 & 1 & -2 \\ 1 & 1 & 1 & -1 & -1 & -1 \\ 1 & -2 & 1 & -1 & 2 & -1 \\ 1 & 1 & -2 & -1 & -1 & 2 \end{bmatrix} \quad \text{(C-2)}$$

And the voltage and current matrix transformation is shown as following:

$$\dot{U}_{TF}=S\dot{U}_{I\text{-}II} \quad \text{(C-3)}$$

$$\dot{I}_{TF}=S\dot{I}_{I\text{-}II} \quad \text{(C-4)}$$

Wherein, $$\dot{U}_{I\text{-}II}=[\dot{U}_{IA}\dot{U}_{IB}\dot{U}_{IC}\dot{U}_{IIA}\dot{U}_{IIB}\dot{U}_{IIC}]^T$$

$$\dot{U}_{TF}=[\dot{U}_{T0}\dot{U}_{T\alpha}\dot{U}_{T\beta}\dot{U}_{F0}\dot{U}_{F\alpha}\dot{U}_{F\beta}]^T$$

$$\dot{I}_{I\text{-}II}=[\dot{I}_{IA}\dot{I}_{IB}\dot{I}_{IC}\dot{I}_{IIA}\dot{I}_{IIB}\dot{I}_{IIC}]^T$$

$$\dot{I}_{TF}=[\dot{I}_{T0}\dot{I}_{T\alpha}\dot{I}_{T\beta}\dot{I}_{F0}\dot{I}_{F\alpha}\dot{I}_{F\beta}]^T$$

Impedance matrix transformation is shown as following:

$$Z_{TF}=S^{-1}ZS \quad \text{(C-5)}$$

After the transformation, the complete decoupling impedance matrix is shown as following:

$$Z_{TF}=\text{diag}[Z_{T0}Z_{T\alpha}Z_{T\beta}Z_{F0}Z_{F\alpha}Z_{F\beta}] \quad \text{(C-6)}$$

Wherein, $$Z_{T0}=Z_S+2Z_M+3Z'_{M0}$$

$$Z_{F0}=Z_S+2Z_M-3Z'_M$$

$$Z_{T\alpha}=Z_S-Z_M$$

$$Z_{F\alpha}=Z_S-Z_M$$

$$Z_{T\beta}=Z_S-Z_M$$

$$Z_{F\beta}=Z_S-Z_M$$

$Z_S$ is the self-reactance; $Z_M$ is the phase mutual reactance in one circuit; and $Z'_M$ is line mutual reactance between two circuits;

Admittance matrix transformation is shown as following:

$$Y_{TF}=S^{-1}YS \quad \text{(C-7)}$$

After the transformation, the complete decoupling admittance matrix is shown as following:

$$Y_{TF}=\text{diag}[Y_{T0}Y_{T\alpha}Y_{T\beta}Y_{F0}Y_{F\alpha}Y_{F\beta}] \quad \text{(C-8)}$$

Wherein, $$Y_{T0}=j\omega C_S$$

$$Y_{F0}=j\omega(C_S+6C'_m)$$

$$Y_{T\alpha}=j\omega(C_S+3C_m+3C'_m)$$

$$Y_{F\alpha}=j\omega(C_S+3C_m+3C'_m)$$

$$Y_{T\beta}=j\omega(C_S+3C_m+3C'_m)$$

$$Y_{F\beta}=j\omega(C_S+3C_m+3C'_m)$$

$C_S$ is the grounding capacitance; $C_m$ is the inter-phase capacitance; and $C'_m$ is the inter-line capacitance.

The propagation constant of different module is shown as following:

$$\gamma_{T0}=\sqrt{Z_{T0}Y_{T0}},\gamma_{T\alpha}=\sqrt{Z_{T\alpha}Y_{T\alpha}},\gamma_{T\beta}=\sqrt{Z_{T\beta}Y_{T\beta}},$$

$$\gamma_{F0}=\sqrt{Z_{F0}Y_{F0}},\gamma_{F\alpha}=\sqrt{Z_{F\alpha}Y_{F\alpha}},\gamma_{F\beta}=\sqrt{Z_{F\beta}Y_{F\beta}}$$

The wave impedance of different module is shown as following:

$$Z_{cT0}=\sqrt{Z_{T0}/Y_{T0}},Z_{cT\alpha}=\sqrt{Z_{T\alpha}/Y_{T\alpha}},Z_{cT\beta}=\sqrt{Z_{T\beta}/Y_{T\beta}},$$

$$Z_{cF0}=\sqrt{Z_{F0}/Y_{F0}},Z_{cF\alpha}=\sqrt{Z_{F\alpha}/Y_{F\alpha}},Z_{cF\beta}=\sqrt{Z_{F\beta}/Y_{F\beta}}$$

When the fault occurs, the terminal voltage and current is known, and lm is the distance from fault point to terminal m. The fault point voltage and current can be calculated by the following equation. It should be noted that in this criterion it only needs to calculate the fault point voltage.

$$\begin{cases} \dot{U}_{fT0} = \dot{U}_{mT0}\cosh\gamma_{T0}l_m - Z_{cT0}\dot{I}_{mT0}\sinh\gamma_{T0}l_m \\ \dot{U}_{fT\alpha} = \dot{U}_{mT\alpha}\cosh\gamma_{T\alpha}l_m - Z_{cT\alpha}\dot{I}_{mT\alpha}\sinh\gamma_{T\alpha}l_m \\ \dot{U}_{fT\beta} = \dot{U}_{mT\beta}\cosh\gamma_{T\beta}l_m - Z_{cT\beta}\dot{I}_{mT\beta}\sinh\gamma_{T\beta}l_m \\ \dot{U}_{fF0} = \dot{U}_{mF0}\cosh\gamma_{F0}l_m - Z_{cF0}\dot{I}_{mF0}\sinh\gamma_{F0}l_m \\ \dot{U}_{fF\alpha} = \dot{U}_{mF\alpha}\cosh\gamma_{F\alpha}l_m - Z_{cF\alpha}\dot{I}_{mF\alpha}\sinh\gamma_{F\alpha}l_m \\ \dot{U}_{fF\beta} = \dot{U}_{mF\beta}\cosh\gamma_{F\beta}l_m - Z_{cF\beta}\dot{I}_{mF\beta}\sinh\gamma_{F\beta}l_m \end{cases} \quad \text{(C-9)}$$

-continued $$\begin{cases} \dot{I}_{fT0} = \dot{I}_{mT0}\cosh\gamma_{T0}l_m - (\dot{U}_{mT0}/Z_{cT0})\sinh\gamma_{T0}l_m \\ \dot{I}_{fT\alpha} = \dot{I}_{mT\alpha}\cosh\gamma_{T\alpha}l_m - (\dot{U}_{mT\alpha}/Z_{cT\alpha})\sinh\gamma_{T\alpha}l_m \\ \dot{I}_{fT\beta} = \dot{I}_{mT\beta}\cosh\gamma_{T\beta}l_m - (\dot{U}_{mT\beta}/Z_{cT\beta})\sinh\gamma_{T\beta}l_m \\ \dot{I}_{fF0} = \dot{I}_{mF0}\cosh\gamma_{F0}l_m - (\dot{U}_{mF0}/Z_{cF0})\sinh\gamma_{F0}l_m \\ \dot{I}_{fF\alpha} = \dot{I}_{mF\alpha}\cosh\gamma_{F\alpha}l_m - (\dot{U}_{mF\alpha}/Z_{cF\alpha})\sinh\gamma_{F\alpha}l_m \\ \dot{I}_{fF\beta} = \dot{I}_{mF\beta}\cosh\gamma_{F\beta}l_m - (\dot{U}_{mF\beta}/Z_{cF\beta})\sinh\gamma_{F\beta}l_m \end{cases} \quad (C\text{-}10)$$

When the voltage and current of terminal n is known, the fault point voltage and current can be calculated by the same method.

Transform the fault point voltage by using the Karranbauer inverse transformation, the fault point voltage of every phase is shown as following:

$$\dot{U}_{fI\text{-}II} = S^{-1} \cdot \dot{U}_{fTF} \quad (C\text{-}11)$$

For power line with a shunt reactor, the current can flow through the shunt reactor. Therefore, the current used in calculation of fault point voltage is the difference between current flowed in terminal and current flowed in the shunt reactor. The expression of this situation is shown as following:

$$\begin{cases} \dot{I}'_{mT0} = \dot{I}_{mT0} - \dot{U}_{mT0}/(X_L + 3X_N) \\ \dot{I}'_{mT\alpha} = \dot{I}_{mT\alpha} - \dot{U}_{mT\alpha}/X_L \\ \dot{I}'_{mT\beta} = \dot{I}_{mT\beta} - \dot{U}_{mT\beta}/X_L \\ \dot{I}'_{mF0} = \dot{I}_{mF0} - \dot{U}_{mF0}/(X_L + 3X_N) \\ \dot{I}'_{mF\alpha} = \dot{I}_{mF\alpha} - \dot{U}_{mF\alpha}/X_L \\ \dot{I}'_{mF\beta} = \dot{I}_{mF\beta} - \dot{U}_{mF\beta}/X_L \end{cases} \quad (C\text{-}12)$$

The current of another terminal, such as terminal n, can be calculated in the same method. Bring the current calculated by the above equations into equations C-9 and C-10, and the fault point voltage of power line with shunt reactor can be calculated.

Alternatively, the fault point voltage can be estimated by the detected terminal voltage. In some situations without requiring high accuracy, the terminal voltage can be used to imitate fault point voltage, which saves time for calculating actual fault point voltage.

Calculation of Real Time Setting Value

After tripping fault phase, the type of fault has little influence on the sound phase voltage. It is supposed that a transient fault occurs on power line and the secondary arc is extinct. Then it takes the sound phase terminal voltage and fault phase terminal current, which equals to zero, as a known quantity, and use homogeneous power line equation to calculate the sound phase current and fault phase voltage under this condition.

$$[\dot{U}'_{mGZ}\dot{U}_{mJQ}\dot{I}'_{mGZ}\dot{I}_{mJQ}] = [TL][\dot{U}'_{nGZ}\dot{U}_{nJQ}\dot{I}_{nGZ}\dot{I}'_{nJQ}] \quad (C\text{-}13)$$

$\dot{U}'_{mGZ}$ is the column matrix of voltage on faulty phase terminal m; $\dot{U}_{mJQ}$ is the column matrix of voltage on sound phase terminal m; $\dot{I}'_{mGZ}$ is the column matrix of voltage on faulty phase terminal m; and $\dot{I}_{mJQ}$ is the column matrix of current on sound phase terminal m.

The variables of the column matrix on right side of the equation (C-13) have similar meanings. [TL] is the coefficient matrix of homogenous power line equation for the whole line length.

Transform equation (C-13) as following equation (C-14):

$$[\dot{U}'_{mGZ}\dot{I}'_{mJQ}\dot{U}'_{nGZ}\dot{I}'_{nJQ}] = [TP][\dot{I}_{mGZ}\dot{U}_{mJQ}\dot{I}_{nGZ}\dot{U}_{nJQ}] \quad (C\text{-}14)$$

The left side of the equation is unknown quantity, and the right side is known quantity. [TP] is the transfer coefficient matrix.

In case of a transient fault, the fault point voltage after secondary arc extinction can be calculated using the known voltage on sound phase terminal m, the known current on faulty phase terminal m, the calculated voltage on faulty phase terminal m and the calculated current on sound phase terminal m. the method is the same as above equation (C-13).

$$[\dot{U}_{fGZ}\dot{U}_{fJQ}\dot{I}_{fGZ}\dot{I}_{fJQ}] = [Tl][\dot{U}'_{mGZ}\dot{U}_{mJQ}\dot{I}'_{mGZ}\dot{I}_{mJQ}] \quad (C\text{-}15)$$

[TL] is the coefficient matrix of homogenous power line equation for the length from terminal m to the faulty point. Wherein, $U_{fGZ}$ means the fault point voltage in the case of transient fault, and it is calculated in real time. The calculation of other coefficients of the setting value will be introduced in detail thereafter.

Similar to the above calculation of fault point voltage, in the calculation of fault point voltage of power line with shunt reactor in case of transient fault, the terminal current shall subtract the current flowing through shunt reactor.

Alternatively, a fixed value instead of a floating value can be used as setting value for the sake of saving time or cost. In this situation, the setting value can be set according the different type of faults based on capacitive coupling voltage. It is varied with fault type, and, for example, can be set as from 1/3 to 1/2 of the capacitive coupling voltage.

Criterion for Identifying Permanent Grounding Faults

According to present invention, when a grounding fault occurs, calculate fault point voltage by using the terminal voltages, currents and fault location; and calculate a setting value in real time. The third step is to compare the fault point voltage with setting value. The type of fault may be identified from the result of comparison.

It is further supposed that a permanent ground fault occurs and the transition resistance is zero. Therefore, the fault phase voltage at the fault point is zero.

When a transient fault occurs, the fault phase voltage at the fault point is very high after the secondary arc is extinct. Consequently, under this situation, the voltage at fault point is capable of distinguishing a permanent fault from a transient fault effectively.

When a permanent ground fault with transition resistance occurs, however, the fault point voltage increases along with the increasing of transition resistance. For the power line with a heavy load, the fault point voltages of different fault points varied from each other greatly. Therefore, it needs to choose an appropriate setting voltage for different fault types in order to insure the sensitivity and reliability of the criterion. Therefore, a method for distinguishing the permanent fault from transient fault under this situation is necessary. The proposed method is to distinguish the permanent fault from transient fault based on an analysis of voltage relationship between those two different fault types.

For a multi-phase permanent ground fault, it is supposed that there is only one fault ground access. When the permanent ground fault occurs, a schematic graph of the transition resistance configuration is show in FIG. 1.

In FIG. 1, a resistor indicating grounding resistance $R_g$ (11) and several resistors indicating transition resistance $R_{ph}$ (12) are depicted.

Because the inter-phase transition resistance is much less than the grounding transition resistance, in the calculation of fault point voltage of opening phase, the influence of inter-phase transition resistance on opening phase voltage can be ignored and the voltage on grounding resistance $R_g$ (11) is regarded as the fault point voltage of opening phase.

For different types of permanent ground fault, after tripping the fault phase breakers, the fault can be regarded as an equivalent network between the fault point and earth, and the internal system equals to a series of voltage sources and impedances. The magnitude of equivalent voltage source is the same as the fault point voltage when the grounding branch is opened. It equals to the fault point voltage when the ground fault disappears and inter-phase fault still exists. The equivalent impedance is the impedance detected from the fault point when the internal system voltage source is zero. A Thevenin's equivalent circuit of power line at fault point when a grounding fault with transition resistance occurs is show in FIG. 2.

Figure 2:
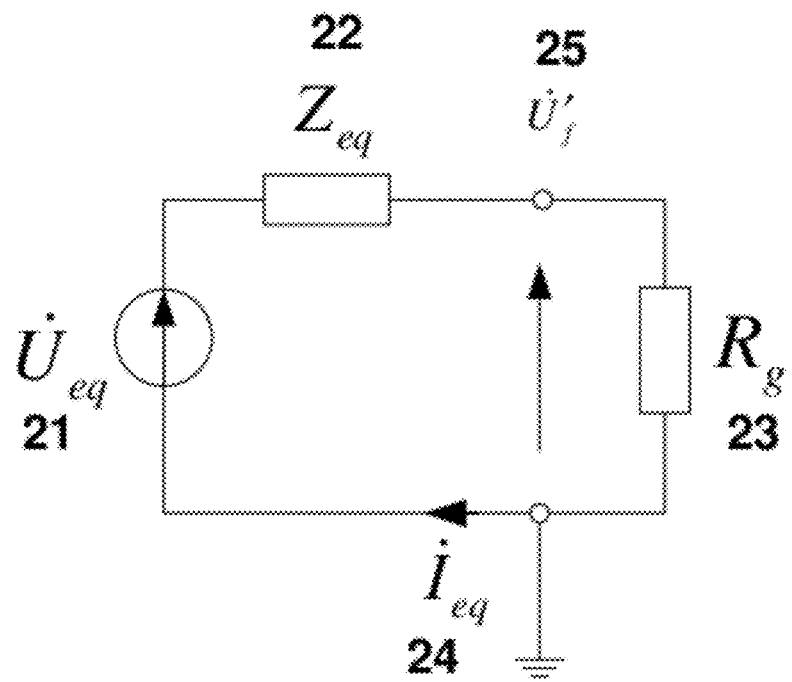
FIG. 2 shows a diagram of Thevenin's equivalent circuit of power line at fault point when a grounding fault with transition resistance occurs.

In the circuit depicted in FIG. 2, a resistor $R_g$, (23) a voltage source $U_{eq}$ (21) and an impedance $Z_{eq}$ (22) are connected with each other in series.

When the permanent ground fault with transition resistance occurs, the relationship of fault point voltage $\dot{U}'_f$ (25) and internal equivalent voltage source $\dot{U}_{eq}$ (21) is shown in the following equations:

$$\dot{U}'_f = \frac{R_g}{R_g + Z_{eq}} \dot{U}_{eq} \qquad \text{(I-1)}$$
$$= k_R \angle \theta \dot{U}_{eq}$$

Wherein, $k_R \angle \theta$ is a voltage division factor of transition resistance.

$$k_R = \frac{R_g}{\sqrt{R_g^2 + Z_{eq}^2}}, \theta = arg\left(\frac{R_g}{R_g - jZ_{eq}}\right) \qquad \text{(I-2)}$$

$Z_{eq}$ (22) is an equivalent impedance of the whole system detected at the fault point. Fault phase is connected to sound phase by the inter-phase or inter-line capacitance and inductance after tripping the fault phase. The line capacitive reactance is much more than line impedance, so the impedance can be ignored. The equivalent impedance is the grounding capacitive reactance of all opening phases. For all types of fault, the expression of equivalent grounding impedance of opening phase at the fault point is:

$$Z_{eq} = Y_{eq}^{-1} \qquad \text{(I-3)}$$

$$Y_{eq} = \sum_{i \in GZ} Y_{is} + \sum_{i \in GZ} \sum_{\substack{j \in GZ \\ i \neq j}} (-Y_{ij}) \qquad \text{(I-4)}$$

$$= [1 \ \ldots \ 1]_{1 \times n} Y_{GZn \times n} [1 \ \ldots \ 1]_{1 \times n}^T$$

The above equations indicate that the equivalent admittance at fault point ($Y_{eq}$) is the sum of all elements of fault admittance matrix.

The magnitude of equivalent voltage source equals to the fault point voltage when ground fault is extinct and inter-phase fault still exists. Under this condition, the fault point voltage is the sum of capacitive coupling voltage $\dot{U}_{Yeq}$ and electromagnetic coupling voltage $\dot{U}_{Xeq}$. They are calculated respectively as following.

Only taking the influence of capacitive coupling voltage on equivalent voltage source into consideration, setting the electromagnetic coupling voltage of fault phase to zero and only remaining the sound phase, the capacitive coupling voltage of equivalent voltage source is generated by the coupling effect of line capacitance. For all types of fault, the equation of capacitive coupling voltage $\dot{U}_{Yeq}$ is as following:

$$\dot{U}_{Yeq} = ([1 \ \ldots \ 1]_{1 \times n} Y_{GZ,n \times n} [1 \ \ldots \ 1]_{1 \times n}^T)^{-1}$$
$$[1 \ \ldots \ 1]_{1 \times n} Y_{GZ\text{-}JQ,n \times (6-n)} \dot{U}_{JQ,(6-n) \times 1} \qquad \text{(I-5)}$$

The capacitive coupling voltage of opening phase in case of transient fault is:

$$\dot{U}_{y,n \times 1} = Y_{GZ,n \times n}^{-1} Y_{GZ\text{-}JQ,n \times (6-n)} \dot{U}_{JQ,(6-n) \times 1} \qquad \text{(I-6)}$$

The relationship of capacitive coupling voltages in case of permanent fault and that of transient fault of two-port network is:

$$\dot{U}_{Yeq} = ([1 \ \ldots \ 1]_{1 \times n} Y_{GZ,n \times n} [1 \ \ldots \ 1]_{1 \times n}^T)^{-1}$$
$$[1 \ \ldots \ 1]_{1 \times n} Y_{GZ,n \times n} \dot{U}_{y,n \times 1} \qquad \text{(I-7)}$$

Figure 3:
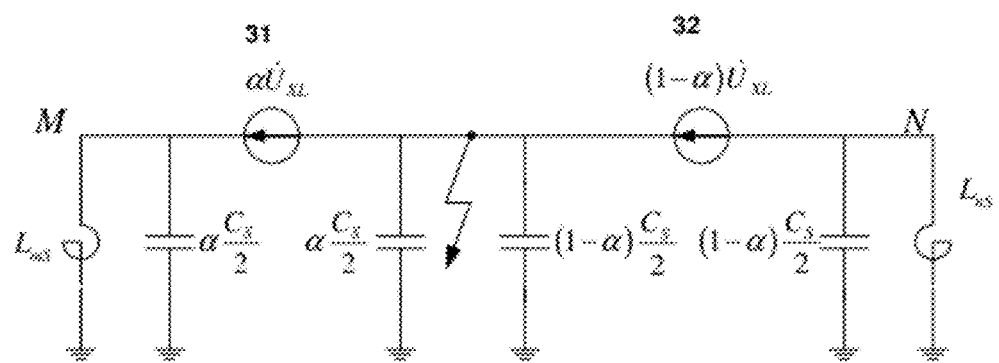
FIG. 3 shows a diagram of analysis circuit of electromagnetic coupling effect.

FIG. 3 shows the schematic graph of an analysis circuit of electromagnetic coupling effect, wherein, the line impedance is ignored.

It is supposed that the proportion between distance from fault point to side m and the whole length is $\alpha$, and the proportion between distance from fault point to side n and the whole length is $1-\alpha$. Because the influence of a sound phase voltage on short circuit current has been considered in capacitive coupling effect, in the consideration of electromagnetic coupling effect on equivalent voltage source of two-port network in case of permanent fault, the voltage of sound phase is set as zero.

For all types of fault, the equation of electromagnetic coupling voltage at fault point is:

$$\dot{U}_{Xeq} = ([1 \ \ldots \ 1]_{1 \times n} Y_{GZ,n \times n} [1 \ \ldots \ 1]_{1 \times n}^T)^{-1} [1 \ \ldots \ 1]_{1 \times n} \qquad \text{(I-8)}$$
$$Y_{GZn \times n} \left(\frac{1}{2} - \alpha\right) \dot{U}_{XL,n \times 1}$$

The electromagnetic coupling voltage of opening phase at fault point in case of transient fault is:

$$\dot{U}_{x,n \times 1} = \left(\frac{1}{2} - \alpha\right) \dot{U}_{XL,n \times 1} \qquad \text{(I-9)}$$

The relationship between the electromagnetic coupling voltage of two-port network equivalent voltage source in case of permanent fault and the electromagnetic coupling voltage of opening phase at fault point in case of transient fault is:

$$\dot{U}_{Xeq} = ([1 \ \ldots \ 1]_{1 \times n} Y_{GZ,n \times n} [1 \ \ldots \ 1]_{1 \times n}^T)^{-1} [1 \ \ldots \ 1]_{1 \times n} Y_{GZ,n \times n} \dot{U}_{GZx,n \times 1} \qquad \text{(I-10)}$$

As known from superposition theorem, the equivalent voltage source of the two port network equals to the sum of capacitive coupling voltage and electromagnetic coupling voltage. Therefore, the relationship between voltage source of two-port network in case of permanent fault and fault point voltage in case of transient fault is obtained from equation (I-10) and (I-7):

$$\dot{U}_{eq} = ([1 \quad \ldots \quad 1]_{1\times n} Y_{GZ,n\times n} [1 \quad \ldots \quad 1]_{1\times n}^T)^{-1} [1 \quad \ldots \quad 1]_{1\times n} \quad \text{(I-11)}$$

$$Y_{GZ,n\times n} (\dot{U}_{x,n\times 1} + \dot{U}_{y,n\times 1})$$

$$= ([1 \quad \ldots \quad 1]_{1\times n} Y_{GZ,n\times n} [1 \quad \ldots \quad 1]_{1\times n}^T)^{-1} [1 \quad \ldots \quad 1]_{1\times n}$$

$$Y_{GZ,n\times n} \dot{U}_{g\text{-}open,n\times 1}$$

$$= M_{1\times n} \dot{U}_{g\text{-}open,n\times 1}$$

As known from above deduction and equations, when the fault point voltage is known in case of transient fault, the internal equivalent voltage source of equivalent network at fault point can be calculated in case of permanent fault. The fault point voltage in case of permanent grounding fault with transition resistance can be calculated by equations (I-11) and (I-1) below:

$$\dot{U}'_f = k_R \angle \theta M_{1\times n} \dot{U}_{g\text{-}open,n\times 1} \quad \text{(I-12)}$$

Wherein, $U_{g\text{-}open}$ means the fault point voltage in case of transient fault, and it equals to the $U_{fGZ}$ in equation (C-15). When a grounding fault occurs in a power line, the fault point voltage can be calculated based on the terminal voltage and current. The matrix is showed on equation (I-13) below:

$$\dot{U}_f = [\dot{U}_{GZ1}, \dot{U}_{GZ2}, \ldots, \dot{U}_{GZn}] \quad \text{(I-13)}$$

Taking the fault point voltage at the maximum transition resistance (i.e., 300Ω at voltage grade of 500 kV) as the setting value, the criterion is shown as follow:

$$|M \cdot \dot{U}_f| < U_{GDZ} \quad \text{(I-14)}$$

$$U_{GDZ} = k_k \cdot k_R \cdot |M \cdot \dot{U}_{g\text{-}open}| \quad \text{(I-15A)}$$

Wherein, $k_k$ is the reliability coefficient, and the value thereof can be taken from 1.1 to 1.3. $k_R$ is a voltage division factor when the transition resistance is chosen as 300Ω (maximum value) for EHV (Extremely High Voltage) power lines. M is a voltage coefficient matrix of opened phases, and it indicates the power line's parameter and fault type.

When a permanent fault occurs, the voltages of all fault points (for example the fault point voltage in FIG. 2) are the same as the left side of equation (I-14), i.e., $|M \cdot \dot{U}_f| = |\dot{U}'_f|$. It can be seen from the equation (I-14) that the criterion can distinguish permanent fault exactly when the transition resistance is less than 300Ω. That is to say, when the absolute value of fault point voltage is bigger than the setting value, the fault is determined as a transient fault, and when the absolute value of fault point voltage is less than the setting value, the fault is determined as a permanent fault.

When a transient fault occurs, if the coefficient of $k_k \cdot k_R$ on right side of equation (I-15) is less than 1, the criterion can distinguish transient fault exactly. Because the equivalent internal impedance is much more than transition resistance, it can satisfy the condition easily.

Alternatively, the middle value between fault point voltage at the maximum transition resistance (i.e., 300Ω at voltage grade of 500 kV) in case of permanent fault and fault point voltage in case of transient fault may be also adopted as the setting value. In this situation, the criterion is shown as follow:

$$U_{GDZ} = \left(k_{R\text{-}max} + \frac{1 - k_{R\text{-}max}}{2}\right) \cdot |M \cdot \dot{U}_{g\text{-}open}| \quad \text{(I-15B)}$$

Wherein, $k_{R\text{-}max}$ is a voltage division factor when the transition resistance is chosen as 300Ω for EHV power lines. M is a voltage coefficient matrix of opened phases.

When a permanent fault occurs, the voltages of all fault points are smaller than the left side of equation (I-14), i.e., $$|M \cdot \dot{U}_f| = k_{R\text{-}max} \cdot |M \cdot \dot{U}_{g\text{-}open}| < \left(k_{R\text{-}max} + \frac{1 - k_{R\text{-}max}}{2}\right) \cdot |M \cdot \dot{U}_{g\text{-}open}|.$$

It can be seen from the equation (I-14) that the criterion can distinguish permanent fault exactly when the transition resistance is less than 300Ω.

When a transient fault occurs, the coefficient of $$k_R + \frac{1 - k_R}{2}$$

on right side of equation (I-15B) is less than 1, so the criterion can distinguish transient fault exactly. Because the equivalent internal impedance is much more than transition resistance, it can satisfy the condition easily.

Criterion for Identifying Permanent Inter-Phase Faults

When the multi-phase grounding fault occurs on single line or across lines, due to the influence of decaying DC (Direct Current) component, the inter-phase secondary arc may still exist after the extinction of secondary arc of grounding branches. Therefore, it is necessary to distinguish the fault property of inter-phase branches after the secondary arc of grounding branches is extinct. For an inter-phase fault situation only, this step can be taken directly without the step for identifying the type of grounding faults.

Similar to the grounding fault, when an inter-phase fault occurs, the power line can be regarded as a two-port network taken from the across lines fault point. The internal part of the network is a voltage source with internal impedance. Ignoring the line impedance, the internal impedance is the equivalent transfer impedance between opening phases of the double circuit lines, the voltage source is the difference of voltages at fault point on different opening phases in case of transient fault.

Compare the product of a sum of opening phase voltage at fault point and coefficient with setting value, in order to identify whether the secondary arc is extinct on grounding branches. The criterion is shown on above equations I-14 and I-15. According to above analysis, the criterion can distinguish permanent grounding fault from transient grounding fault exactly when the transition resistance is less than 300Ω.

The methods to distinguish whether the inter-phase secondary arc is extinct contain the following two approaches.

Faults across lines having different phases contain fault types such as IAΠB (i.e., inter-phase fault between phase A of line I and phase B of line II), IABΠA (i.e., inter-phase fault between phases A, B of line I and phase A of line II), IABΠC (i.e., inter-phase fault between phases A, B of line I and phase C of line II) and IABΠBC (i.e., inter-phase fault between phases A, B of line I and phases B, C of line II).

When above types of permanent inter-phase fault occurs, the fault points of every opening phase physically connect with each other at one point, and therefore the difference of voltages at fault point on opening phases equals to zero.

When above types of transient fault occurs, after the extinction of secondary arc, the coupling voltages of opening phases at fault point are different from each other. So the difference of fault point voltages does not equal to zero (e.g., larger than zero). Therefore, the fault property of permanent types and transient types can be distinguished by calculating the difference of fault point voltages. The criterion for identifying different types of inter-phase faults is:

$$|\dot{U}_{f(I-II)}|<U_{LDZ} \quad (P-1)$$

Wherein, $\dot{U}_{f(I-II)}$ is the difference of voltages at the fault point on opening phases of double circuit lines. The $U_{LDZ}$ in equation (P-1) is a setting value under this situation, it is the voltage difference between different opening phases. $U_{LDZ}$ can be set similarly according to the $U_{GDZ}$ in the method of identifying different types of grounding fault. Because the transition resistance of phase-to-phase fault is very small (usually, the transition resistance between different phases is estimated less than 30Ω), the magnitude of voltage difference at fault point in case of permanent fault is very small, and the setting value can be set as a fixed threshold value which changes with fault type and can be set as from ⅓ to ½ of the capacitive coupling voltage. For multi-phase fault, it needs to make difference respectively for those opening phases.

For inter-phase fault or same-name phase fault across lines, the typical fault contains IAB and IAIIA. Because the base frequency coupling voltages of opening phases are the same, the fault property can not be distinguished by difference of voltages at fault point on the opening phases. Therefore, this criterion adopts the method of reclosing one of the fault phase and measure the terminal voltage of the other phase to distinguish permanent inter-phase fault. The criterion is showed as following:

$$||\dot{U}_{CH}|-|\dot{U}_{OP}||<U_{PDZ} \quad (P-2)$$

Wherein, $U_{CH}$ is the reclosed phase voltage, and $U_{OP}$ is the opened phase voltage. If it is a permanent inter-phase fault, the voltage of fault phase which has not reclosed is the same as the voltage of a reclosed phase and is close to the line rated voltage.

If it is a transient fault, the voltage of fault phase which has not reclosed is very small and is the coupling voltage only. Therefore, the voltage magnitude of a fault phase which has not reclosed can be used to distinguish fault property. $U_{PDZ}$ can be set as from ⅓ to ½ of the rated voltage.

Figure 4:
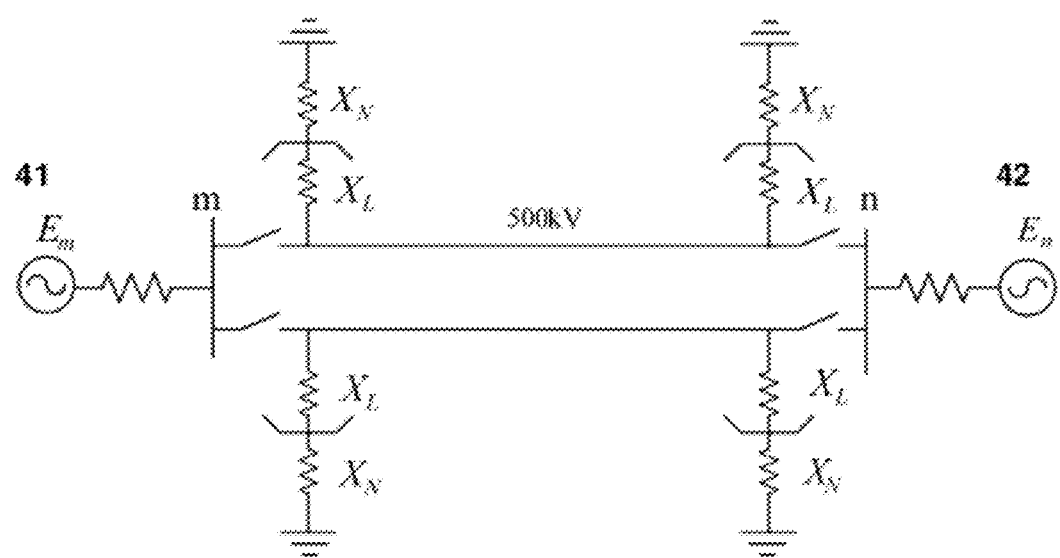
FIG. 4 shows a diagram of typical double-circuit line system.

An example of a typical model of double-circuit power line is shown in FIG. 4. In FIG. 4, the Em on left side indicates Terminal m, and the En on right side indicates Terminal n. The middle part of indicates a double circuit power line. The main parameters in the double-circuit line model are shown below:

Sources and line parameters:

$Z_{M1}$=i49.34Ω; $Z_{M0}$=i41.34Ω; $Z_{N1}$=i46.03Ω; and $Z_{M0}$=i103.36Ω.

Line parameter:

Zs=0.12517+j0.37804 Ω/km; Zm=0.091167+j0.16441 Ω/km; Zm'=0.090833+j0.12043 Ω/km; Ys=j4.5605×10$^{-6}$ S/km; Ym=j6.545×10$^{-7}$ S/km; and Ym'=j3.082×10$^{-7}$ S/km.

Moreover, the compensation degree of the shunt reactor is 75%. The length of power line is 300 km, and the shunt reactor is disposed at the receiving end, $X_L$=852Ω, $X_N$=250Ω. The length of power line is 500 km, and shunt reactor is disposed at both sides, $X_L$=1023Ω, $X_N$=300Ω.

It should be noted that above parameter's value is illustrated as an example only. The parameters in actual double circuit line system can be set as different values according to actual requirements.

Choose of Parameter M and $k_R$ for all Types of Grounding Faults

M is the matrix and $k_R$ is resistance division factor in the criterion. Using the line parameter of FIG. 4 as an example, M and $k_R$ for all types of faults are showed as below.

Parameters M and $k_R$ for all types of fault of power line (100 km) with no shunt reactor are shown in the following table.

TABLE 1

Parameter M and $k_R$ for all types of fault of power line (100 km) with no shunt reactor

| Fault type | IA | IAB | IAIIA | IAIIB | IABIIA | IABIIC | IABIIBC |
|---|---|---|---|---|---|---|---|
| M | [1] | $\begin{bmatrix}0.5\\0.5\end{bmatrix}^T$ | $\begin{bmatrix}0.5\\0.5\end{bmatrix}^T$ | $\begin{bmatrix}0.5\\0.5\end{bmatrix}^T$ | $\begin{bmatrix}0.323\\0.323\\0.354\end{bmatrix}^T$ | $\begin{bmatrix}0.323\\0.323\\0.354\end{bmatrix}^T$ | $\begin{bmatrix}0.25\\0.25\\0.25\\0.25\end{bmatrix}^T$ |
| $k_R$ | 0.14 | 0.23 | 0.25 | 0.25 | 0.32 | 0.32 | 0.36 |

Parameters M and $k_R$ for all types of fault of power line (300 km) with shunt reactor at side n is shown in the following table.

TABLE 2

Parameter M and $k_R$ for all types of fault of power line (300 km) with shunt reactor at side n

| Fault type | IA | IAB | IAIIA | IAIIB | IABIIA | IABIIC | IABIIBC |
|---|---|---|---|---|---|---|---|
| M | [1] | $\begin{bmatrix}0.5\\0.5\end{bmatrix}^T$ | $\begin{bmatrix}0.5\\0.5\end{bmatrix}^T$ | $\begin{bmatrix}0.5\\0.5\end{bmatrix}^T$ | $\begin{bmatrix}0.369\\0.369\\0.262\end{bmatrix}^T$ | $\begin{bmatrix}0.369\\0.369\\0.262\end{bmatrix}^T$ | $\begin{bmatrix}0.25\\0.25\\0.25\\0.25\end{bmatrix}^T$ |
| $k_R$ | 0.11 | 0.21 | 0.17 | 0.17 | 0.22 | 0.22 | 0.21 |

Parameters M and $k_R$ for all types of fault of power line (500 km) with shunt reactor at double ends is shown in the following table.

TABLE 3

Parameter M and $k_R$ for all types of fault of power line (500 km) with shunt reactor at double ends

| Fault type | IA | IAB | IAIIA | IAIIB | IABIIA | IABIIC | IABIIBC |
|---|---|---|---|---|---|---|---|
| M | [1] | $\begin{bmatrix} 0.5 \\ 0.5 \end{bmatrix}^T$ | $\begin{bmatrix} 0.5 \\ 0.5 \end{bmatrix}^T$ | $\begin{bmatrix} 0.5 \\ 0.5 \end{bmatrix}^T$ | $\begin{bmatrix} 0.369 \\ 0.369 \\ 0.262 \end{bmatrix}^T$ | $\begin{bmatrix} 0.369 \\ 0.369 \\ 0.262 \end{bmatrix}^T$ | $\begin{bmatrix} 0.25 \\ 0.25 \\ 0.25 \\ 0.25 \end{bmatrix}^T$ |
| $k_R$ | 0.19 | 0.34 | 0.27 | 0.27 | 0.35 | 0.35 | 0.34 |

From these tables, it is known that M changes following the compensation of shunt reactors, but the coefficients of every opened phase are close to each other when equivalent inter-phase capacitance is similar to equivalent inter-line capacitance. No matter what the situation is, $k_R$ keeps smaller than 0.5. So, there is a huge dipartite degree between permanent fault and transient fault.

It should be noted that above criterions for identifying faults are not only limited to double circuit line. It can be similarly applied to other multiple circuit line systems or single power line. For example, in a four circuit line system, there is very few possibility of having a three-line fault. In most situations, only the single line and two-line fault should be considered. Therefore, above criterion can be adopted to identify the type of fault on any single line or two lines of a power line.

The Adaptive Identifying Criterion and Reclosure Scheme

The specific scheme for every typical fault is shown as from FIG. 5 to FIG. 12.

Figure 5:
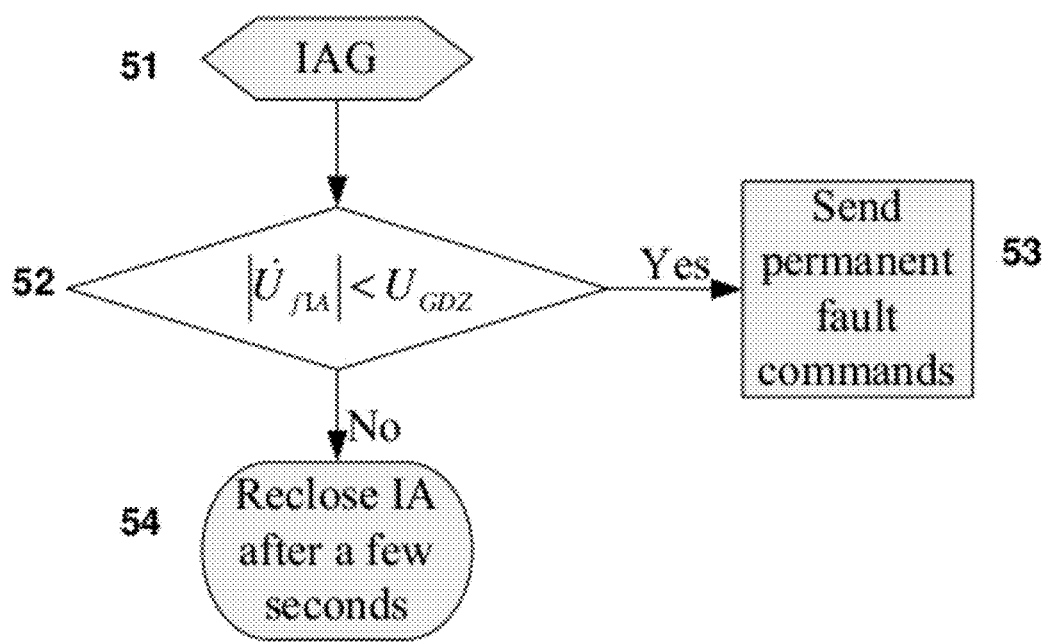
FIG. 5 shows a diagram of adaptive identifying criterion and reclosure scheme for IAG fault.

FIG. 5 shows an adaptive criterion and reclosure scheme for IAG fault. It is determined in step 52 that whether $|U_{fIA}|$ is smaller than $U_{GDZ}$. If the $|U_{fIA}|$ is smaller than $U_{GDZ}$, the step goes to 53. In step 53, a permanent fault command is sent out. If the $|U_{fIA}|$ is not smaller than $U_{GDZ}$, the step goes to 54. In step 54, phase A on line I is reclosed after a few seconds.

Figure 6:
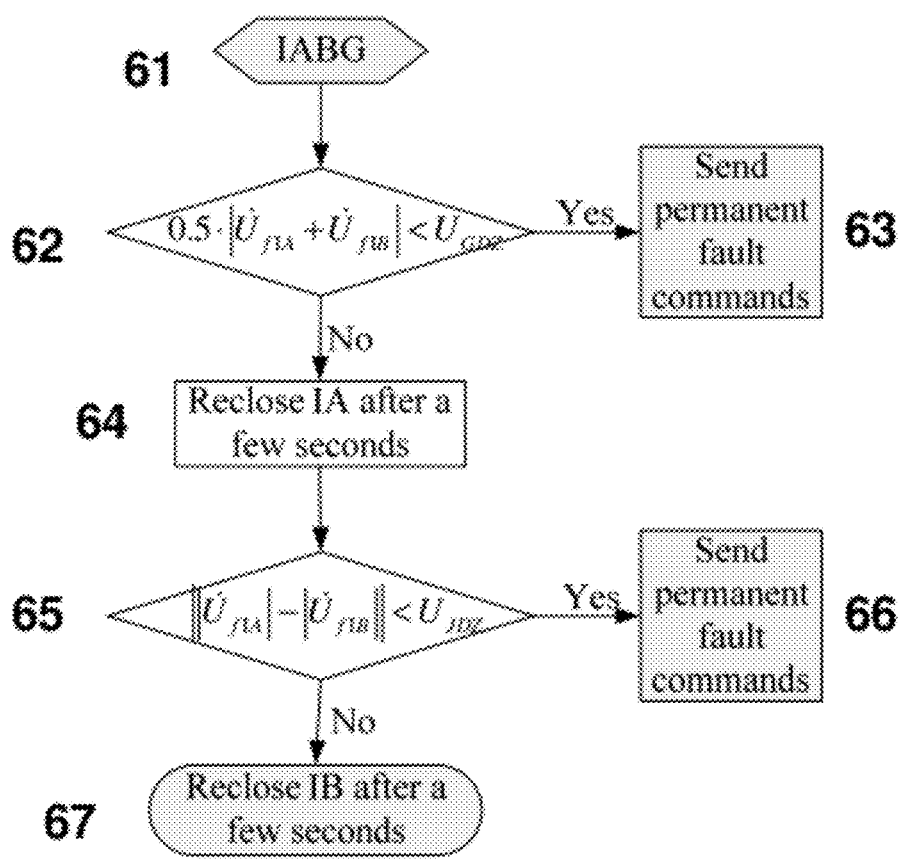
FIG. 6 shows a diagram of adaptive identifying criterion and reclosure scheme for IABG fault.

FIG. 6 shows an adaptive criterion and reclosure scheme for IABG fault. It is determined in step 62 that whether $0.5|U_{fIA}+U_{fIB}|$ is smaller than $U_{GDZ}$. If the $0.5|U_{fIA}+U_{fIB}|$ is smaller than $U_{GDZ}$, the step goes to 63. In step 63, a permanent fault command is sent out. If the $0.5|U_{fIA}+U_{fIB}|$ is not smaller than $U_{GDZ}$, the step goes to 64. In step 64, phase A on line I is reclosed after a few seconds. The process then goes to 65. In step 65, it is determined that whether $||U_{fIA}|-|U_{fIB}||$ is smaller than $U_{jDZ}$. If it is smaller than $U_{jDZ}$, then the process goes to step 66. In step 66, a permanent fault command is sent out. Otherwise, the process goes to step 67, in step 67, phase B on line I is reclosed after a few seconds.

Figure 7:
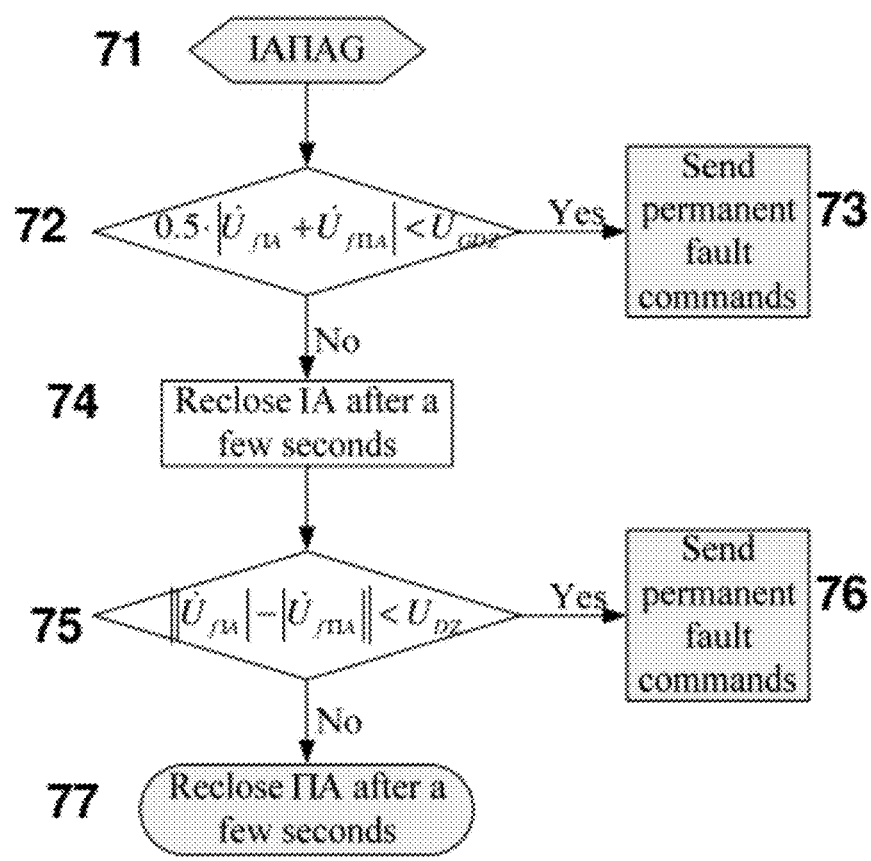
FIG. 7 shows a diagram of adaptive identifying criterion and reclosure scheme for IAIIAG fault.

FIG. 7 shows an adaptive criterion and reclosure scheme for IAIIAG fault. It is determined in step 72 that whether $0.5|\dot U_{fIA}+\dot U_{fIIA}|$ is smaller than $U_{GDZ}$. If the $0.5|\dot U_{fIA}+\dot U_{fIIA}|$ is smaller than $U_{GDZ}$, the step goes to 73. In step 73, a permanent fault command is sent out. If the $0.5|\dot U_{fIA}+\dot U_{fIIA}|$ is not smaller than $U_{GDZ}$, the step goes to 74. In step 74, phase A on line I is reclosed after a few seconds. The process then goes to 75. In step 75, it is determined that whether $||\dot U_{fIA}|-|\dot U_{fIIA}||$ is smaller than $U_{DZ}$. If it is smaller than $U_{DZ}$, then the process goes to step 76. In step 76, a permanent fault command is sent out. Otherwise, the process goes to step 77, in step 77, phase A on line II is reclosed after a few seconds.

Figure 8:
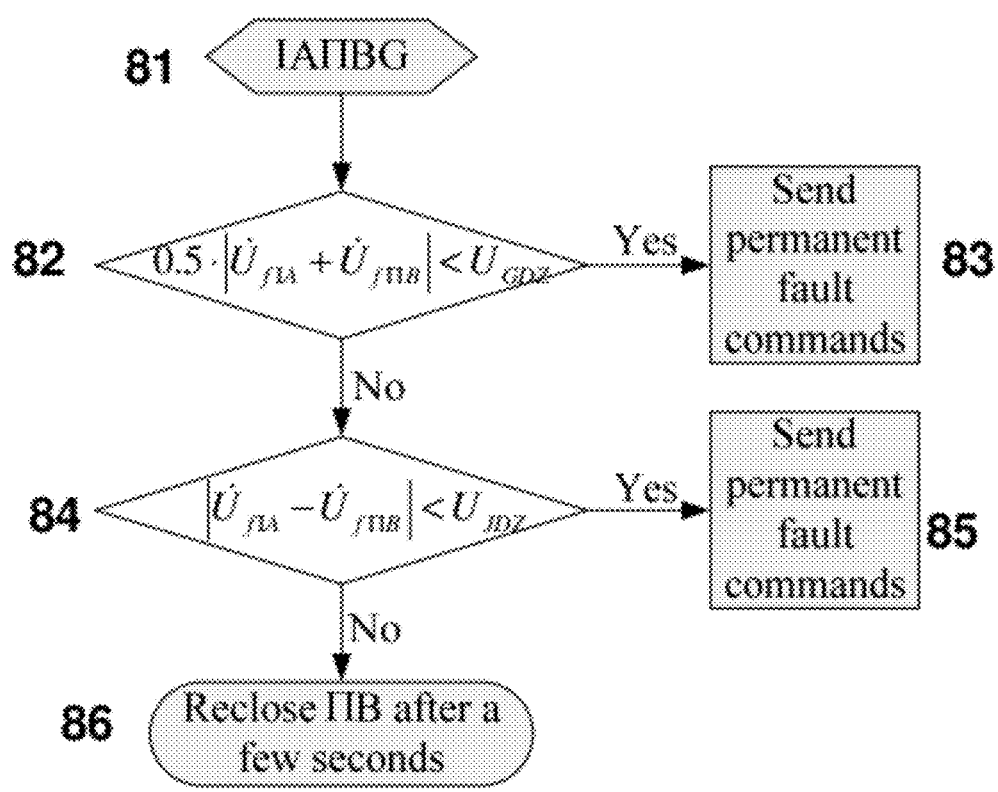
FIG. 8 shows a diagram of adaptive identifying criterion and reclosure scheme for IAIIBG fault.

FIG. 8 shows an adaptive criterion and reclosure scheme for IAIIBG fault. It is determined in step 82 that whether $0.5|\dot U_{fIA}+\dot U_{fIIB}|$ is smaller than $U_{GDZ}$. If the $0.5|\dot U_{fIA}+\dot U_{fIIB}|$ is smaller than $U_{GDZ}$, the step goes to 83. In step 83, a permanent fault command is sent out. If the $0.5|\dot U_{fIA}+\dot U_{fIIB}|$ is not smaller than $U_{GDZ}$, the step goes to 84. In step 84, it is determined that whether $|\dot U_{fIA}-\dot U_{fIIB}|$ is smaller than $U_{jDZ}$. If it is smaller than $U_{jDZ}$, then the process goes to step 85. In step 85, a permanent fault command is sent out. Otherwise, the process goes to step 86, in step 86, phase B on line II is reclosed after a few seconds.

Figure 9:
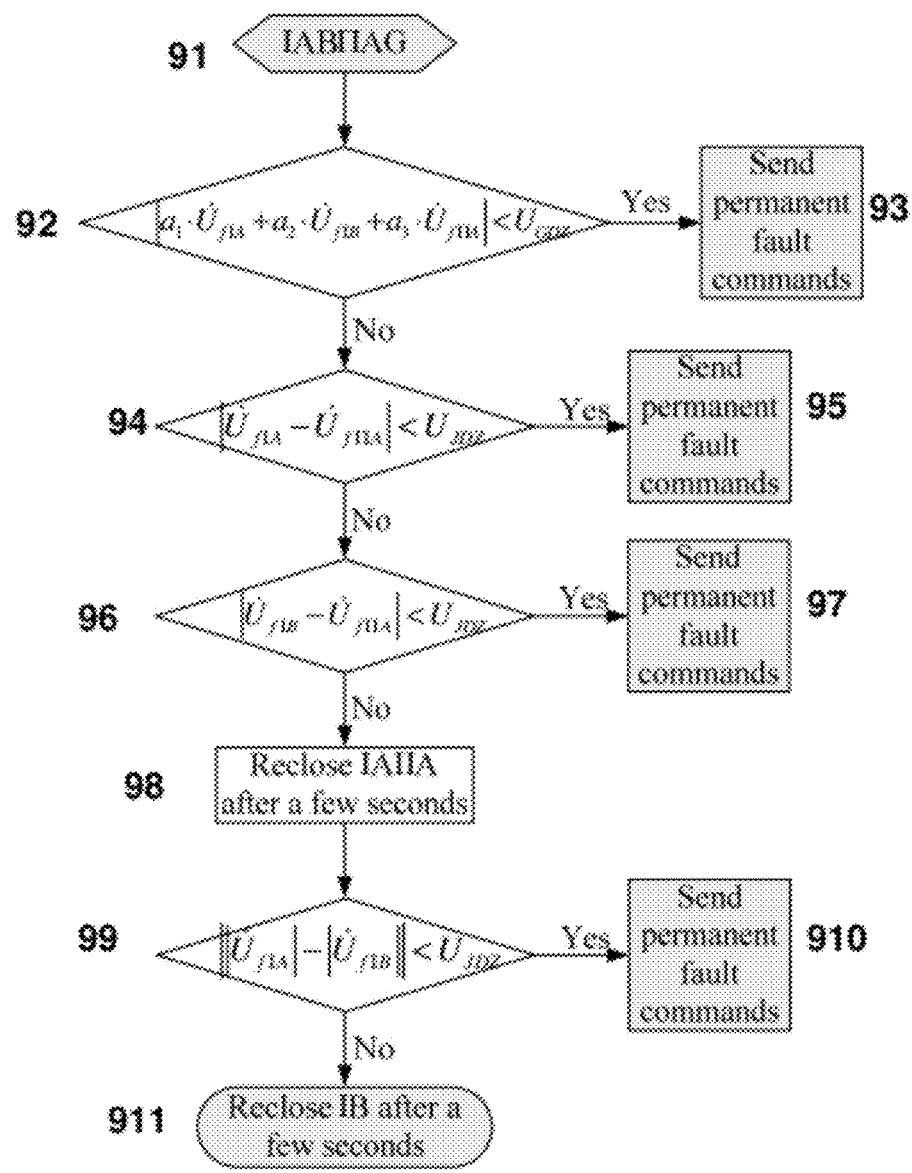
FIG. 9 shows a diagram of adaptive identifying criterion and reclosure scheme for IABIIAG fault.

FIG. 9 shows an adaptive criterion and reclosure scheme for IABIIAG fault. It is determined in step 92 that whether $|a_1\dot U_{fIA}+a_2\dot U_{fIB}+a_3\dot U_{fIIA}|$ is smaller than $U_{GDZ}$. If the $|a_1\dot U_{fIA}+a_2\dot U_{fIB}+a_3\dot U_{fIIA}|$ is smaller than $U_{GDZ}$, the step goes to 93. In step 93, a permanent fault command is sent out. If the $|a_1\dot U_{fIA}+a_2\dot U_{fIB}+a_3\dot U_{fIIA}|$ is not smaller than $U_{GDZ}$, the process goes to step 94. In step 94, it is determined that whether $|\dot U-\dot U_{fIIA}|$ is smaller than $U_{jDZ}$. If $|\dot U_{fIA}-\dot U_{fIIA}|$ is smaller than $U_{jDZ}$, the process goes to step 95. In step 95, a permanent fault command is sent out. If $|\dot U_{fIA}-\dot U_{fIIA}|$ is not smaller than $U_{jDZ}$, the process goes to step 96. In step 96, it is determined that whether $|\dot U_{fIB}-\dot U_{fIIA}|$ is smaller than $U_{jDZ}$. If so, the process goes to step 97, wherein, a permanent fault command is sent out. If $|\dot U_{fIB}-\dot U_{fIIA}|$ is not smaller than $U_{jDZ}$, the process goes to step 98. In step 98, phase A on lines I and II are reclosed after a few seconds. The process goes to step 99, wherein, it is determined that whether $||\dot U_{fIA}|-|\dot U_{fIB}||$ is smaller than $U_{jDZ}$. If so, the process goes to step 910, wherein, a permanent fault command is sent out. Otherwise, the process goes to step 911, wherein phase B on line I is reclosed after a few second.

Figure 10:
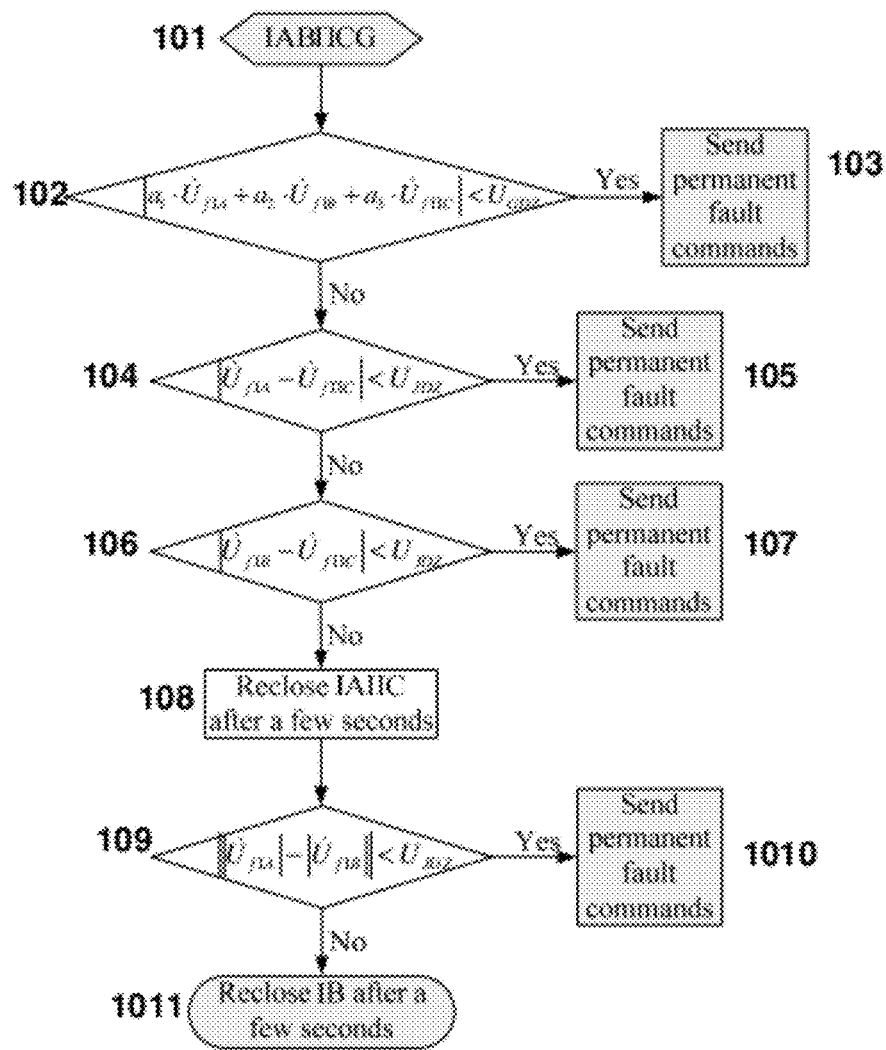
FIG. 10 shows a diagram of adaptive identifying criterion and reclosure scheme for IABIICG fault.

FIG. 10 shows an adaptive criterion and reclosure scheme for IABIICG fault. It is determined in step 102 that whether $|a_1\dot U_{fIA}+a_2\dot U_{fIB}+a_3\dot U_{fIIC}|$ is smaller than $U_{GDZ}$. If so, the step goes to 103, wherein, a permanent fault command is sent out. Otherwise, the process goes to step 104. In step 104, it is determined that whether $|\dot U_{fIA}-\dot U_{fIIC}|$ is smaller than $U_{jDZ}$. If so, the process goes to step 105. In step 105, a permanent fault command is sent out. If otherwise, the process goes to step 106. In step 106, it is determined that whether $|\dot U_{fIB}-\dot U_{fIIC}|$ is smaller than $U_{jDZ}$. If so, the process goes to step 107, wherein, a permanent fault command is sent out. If otherwise, the process goes to step 108. In step 108, phase A on line I and phase C on line II are reclosed after a few seconds. The process then goes to step 109, wherein, it is determined that whether $||\dot U_{fIA}|-|\dot U_{fIB}||$ is smaller than $U_{jDZ}$. If so, the process goes to step 1010, wherein, a permanent fault command is sent out. If otherwise, the process goes to step 1111, wherein phase B on line I is reclosed after a few second.

Figure 11:
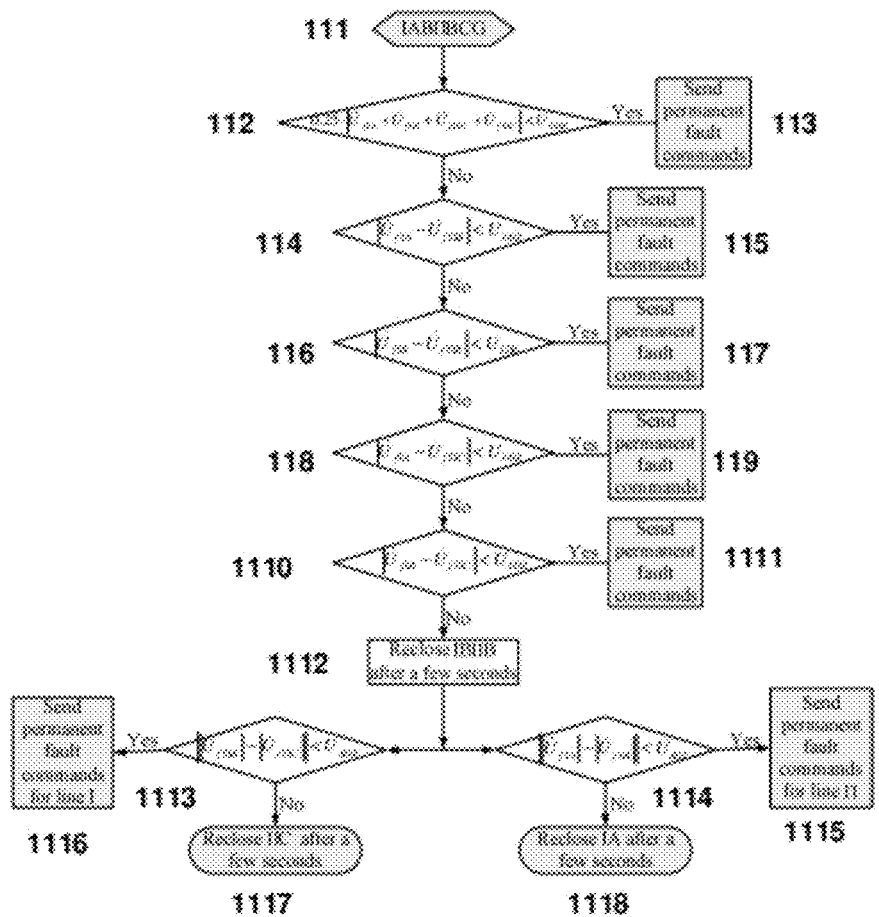
FIG. 11 shows a diagram of adaptive identifying criterion and reclosure scheme for IABIIBCG fault.

FIG. 11 shows an adaptive criterion and reclosure scheme for IABIIBCG fault. It is determined in step 112 that whether $0.25|\dot{U}_{fIA}+\dot{U}_{fIB}+\dot{U}_{fIIB}+\dot{U}_{fIIC}|$ is smaller than $U_{GDZ}$. If so, the step goes to 113, wherein, a permanent fault command is sent out. Otherwise, the process goes to step 114. In step 114, it is determined that whether $|\dot{U}_{fIA}-\dot{U}_{fIIB}|$ is smaller than $U_{jDZ}$. If so, the process goes to step 115. In step 115, a permanent fault command is sent out. If otherwise, the process goes to step 116. In step 116, it is determined that whether $|\dot{U}_{fIB}-\dot{U}_{fIIB}|$ is smaller than $U_{jDZ}$. If so, the process goes to step 117, wherein, a permanent fault command is sent out. If otherwise, the process goes to step 118. In step 118, it is determined that whether $|\dot{U}_{fIA}-\dot{U}_{fIIC}|$ is smaller than $U_{jDZ}$. If so, the process goes to step 119, wherein, a permanent fault command is sent out. If otherwise, the process goes to step 1110. In step 1110, it is determined that whether $|\dot{U}_{fIB}-\dot{U}_{fIIC}|$ is smaller than $U_{jDZ}$. If so, the process goes to step 1111, wherein, phase B on lines I and II are reclosed after a few seconds. Then the process goes to steps 1112 and 1113 respectively. In steps 1112 and 1113, it is respectively determined that whether $||\dot{U}_{fIIB}|-|\dot{U}_{fIIC}||$ is smaller than $U_{jDZ}$ and $||\dot{U}_{fIA}|-|\dot{U}_{fIB}||$ is smaller than $U_{jDZ}$. The process goes to 1114 and 1115 respectively when the answer is affirmative, wherein, a permanent fault command is sent out. Otherwise, the goes to 1116 and 1117 respectively. In step 1116, phase C on line II is reclosed after a few seconds. And in step 1117, phase A on line I is reclosed after a few seconds.

The methods and reclosure schemes of present invention may be implemented as software run on a digital computer, or as a hard-wired implementation using techniques such as EPROM etc. In the case of implementing the proposed method as hardware, it is clear to those skilled in the art that each step for identifying fault type may correspond to a separate hardware unit. For example, a calculation unit may be provided to calculate a fault point voltage on fault points based on terminal voltage and fault locations of the power lines; a setting value setup unit may be provided to adopt the fault point voltage calculated corresponding to a maximum transition resistance as a setting value; a comparing unit may be provided to compare the fault point voltage on fault points with the setting value; and an identifying unit may be provided to identify the type of fault as a permanent type or a transient type based on the result of the comparison, etc.

Alternatively, all the steps may be implemented by an integrated processor. In which, all above separate units are combined together to perform the proposed identifying method. All available semiconductor techniques may be used to produce such hardware.

For those skilled in the art, various modifications can be conceived without departing from the scope of present invention. For example, a set of dependable communication channels and complete function protective relay can be selected to further improve the reliability of the system. Moreover, it is stated that a fixed threshold may be used as the setting value of the criterion to replace floating threshold to improve the operation speed. The invention intends to include all possible modifications within the proposed concept, and the scope of the invention should be defined by the accompanied claims instead of above detailed embodiments.

The invention claimed is:

1. A method for identifying a fault that occurred on parallel double-circuit power lines on a same tower transmitting power, comprising:

calculating a first fault point voltage of a first fault point on a first fault phase of a first circuit multiphase power line of the parallel double-circuit power lines using a first terminal voltage;

calculating a second fault point voltage of a second fault point on a second phase of a second circuit multiphase power line of the parallel double-circuit power lines using a second terminal voltage;

calculating a voltage difference between the first fault point voltage and the second fault point voltage, wherein one of the first fault phase and the second fault phase are in a non-open configuration;

adopting the first fault point voltage corresponding to a maximum transition resistance as a setting value;

first comparing the first fault point voltage with the setting value;

identifying the fault includes a permanent ground type or a transient ground type based on a result of the first comparison;

second comparing the calculated voltage difference with a fault-type-dependent voltage threshold value;

identifying the fault includes a permanent inter-phase type if the voltage difference is less than a voltage difference threshold value or a transient inter-phase type if the magnitude of the voltage difference is greater than the voltage threshold value;

in response to the identifying the fault includes the transient ground type fault, sending commands that reclose fault phase breakers according to the transient inter-phase type fault; and wherein the steps are performed by one or more digital processors.

2. The method according to claim 1, wherein in a case of a same-name phase fault across the first circuit power line and the second circuit power line, one of the faulty phases is an open phase and the other faulty phase is a reclosed phase.

3. The method according to claim 1, wherein in a case of a different-name phase fault across the first circuit power line and the second circuit power line, both of the faulty phases are an open phase.

4. The method according to claim 1, wherein the fault is identified as a permanent type only when the fault point voltage is less than the setting value; and identifying the type of fault as a transient type only when the fault point voltage is higher than the setting value.

5. The method according to claim 1, wherein the voltage difference threshold value is calculated based on voltages and currents on faulty and sound phases and a coefficient matrix of a homogenous power line equation.

6. A non-transitory storage media comprising a computer program for identifying a type of faults that occurred on a power line, wherein, the computer program is loaded into an internal memory of a digital processor and comprises computer program code, which, when executed by the digital processor, causes the digital processor to execute the method according to claim 1.

7. The method according to claim 1, wherein the voltage difference threshold value is calculated based on voltages and currents on faulty and sound phases and a coefficient matrix of a homogenous power line equation.

8. The method according to claim 2, wherein the voltage difference threshold value is calculated based on voltages and currents on faulty and sound phases and a coefficient matrix of a homogenous power line equation.

9. The method according to claim 3, wherein the voltage difference threshold value is calculated based on voltages and currents on faulty and sound phases and a coefficient matrix of a homogenous power line equation.

10. The method according to claim 4, wherein the voltage difference threshold value is calculated based on voltages and currents on faulty and sound phases and a coefficient matrix of a homogenous power line equation.

11. The method according to claim 1, wherein the fault in the parallel double-circuit power lines on the same tower includes at least one of a group consisting of:
- an interphase fault in one line;
- a same-name fault in two lines;
- an interphase fault between a phase of one line and a different phase of a second line;
- an interphase fault between a first and second phases of one line and a first phase of a second line and the first phases are the same;
- an interphase fault between two phases of a first line and a different phase of a second line; and
- an interphase fault between a first and a second phase of a first line and a first and a second phase of a second, and the second phase of the first line and the first phase of the second line are the same.

12. The method according to claim 1, further comprising:
sending at least one permanent fault command for the type of fault identified as the permanent type.

13. A fault type identifying controller for identifying a type of fault that occurred on parallel double-circuit power lines on a same tower transmitting power, comprising:
- a calculating unit that includes one or more digital processors configured to calculate a first fault point voltage of a first fault point using a first terminal voltage on a first fault phase of a first circuit multiphase power line of the parallel double-circuit power lines on the same tower, to calculate a second fault point voltage of a second fault point using a second terminal voltage on a second fault phase of a second circuit multiphase power line of the parallel double-circuit power lines, and to calculate a voltage difference between the first fault point voltage and the second fault point voltage, wherein one of the first fault phase and the second fault phase are in a non-open configuration;
- a setting value setup unit that includes the one or more digital processors configured to adopt the first fault point voltage calculated corresponding to a maximum transition resistance as a setting value;
- a comparing unit that includes the one or more digital processors configured to first compare the first fault point voltage with the setting value and to second compare the calculated voltage difference with a fault-type dependent threshold; and
- an identifying unit that includes the one or more digital processors configured to identify a permanent ground type fault or a transient ground type fault based on a result of the first comparison and to identify a permanent inter-phase type fault if the voltage difference is zero or a transient inter-phase type fault if the voltage difference is greater than zero, and in response to the identified fault including a transient interphase type fault, sending commands that reclose fault phase breakers according to the transient inter-phase type fault.

* * * * *